United States Patent [19]
Lee et al.

[11] Patent Number: 6,075,406
[45] Date of Patent: Jun. 13, 2000

[54] HIGH SPEED DIFFERENTIAL CHARGE PUMP APPARATUS AND METHOD USING A REPLICA CIRCUIT TO CONTROL COMMON MODE OUTPUT VOLTAGE

[75] Inventors: Yeong-Sheng Lee, Milpitas; Young-Jen Sun, Fremont, both of Calif.

[73] Assignee: Macronix International Ltd., Hsinchu, Taiwan

[21] Appl. No.: 09/098,210

[22] Filed: Jun. 16, 1998

[51] Int. Cl.[7] ........................................................ G05F 1/10
[52] U.S. Cl. ............................ 327/538; 327/589; 307/110
[58] Field of Search ................................... 327/536, 537, 327/538, 589, 590, 155, 157; 363/59, 60; 307/35, 110

[56] References Cited

U.S. PATENT DOCUMENTS

| | | | |
|---|---|---|---|
| 5,239,455 | 8/1993 | Fobbester et al. | 327/39 |
| 5,619,161 | 4/1997 | Novof et al. | 327/148 |
| 5,694,072 | 12/1997 | Hsiao et al. | 327/536 |
| 5,705,947 | 1/1998 | Jeong | 327/149 |
| 5,781,048 | 7/1998 | Nakao et al. | 327/147 |
| 5,831,484 | 11/1998 | Lukes et al. | 327/157 |

*Primary Examiner*—Timothy P. Callahan
*Assistant Examiner*—An T. Luu
*Attorney, Agent, or Firm*—LaRiviere, Grubman & Payne, LLP

[57] ABSTRACT

A portion of a differential charge pump circuit is partially replicated and is utilized as a replica circuit to define the common-mode voltage VCM of the differential output voltages of the charge pump circuit that drives a voltage controlled oscillator (VCO) in a PLL system application, or a voltage-controlled delay (VCD) circuit in a DLL system application. The replica circuit includes a high gain operational amplifier and at least three MOS transistors electrically coupled to the differential charge pump circuit. The operational amplifier generates the DC output voltage VO which is used to define the common-mode voltage VCM of the charge pump circuit. The three transistors are configured in replica of one-half of the charge pump circuit. The operational amplifier is provided with a bias voltage at the inverting-end input terminal. During operation, the high gain of the operational amplifier forces the non-inverting end of the operational amplifier to the same value as the bias voltage supplied to the inverting-end input. This voltage equalization effect is referred to as the replica effect. As a result of the replica effect, the charge pump's DC output voltages OUTP and OUTN follow the voltage at non-inverting end of the operational amplifier which results in stable operation of the differential charge pump and a control circuit which is suitable for high-frequency (greater than 400 MHz) application of phase-locked loop (PLL) and delay-locked loop (DLL) systems applications.

9 Claims, 10 Drawing Sheets

(Vo Vs Lambda)

HIGH SPEED DIFFERENTIAL CHARGE PUMP APPARATUS AND METHOD USING A REPLICA CIRCUIT TO CONTROL COMMON MODE OUTPUT VOLTAGE

FIELD OF THE INVENTION

The present invention relates to differential charge pump circuit apparatus and methods used in integrated circuits such as high-speed phase-locked loop (PLL) and delay-locked loop (DLL) circuits. More particularly, the present invention relates to differential charge pump circuit apparatus and methods used in integrated circuits, such as high-speed phase-locked loop (PLL) and delay-locked loop (DLL) circuits for controlling the common-mode output voltage of the charge pump circuit. Even more particularly, the present invention relates to differential charge pump circuit apparatus and methods used in integrated circuits, such as high-speed phase-locked loop (PLL) and delay-locked loop (DLL) circuits for controlling the common-mode output voltage of the charge pump circuit without using common-mode feedback (CMFB) to define the common-mode DC output voltages.

BACKGROUND OF THE INVENTION

A phase-locked loop (PLL) system typically consists of a phase comparator, a charge pump circuit, a RC loop filter and a voltage-controlled oscillator (VCO) as shown in FIG. 1a. The PLL is a negative feedback system which operates in such a way that the phase and frequency of the VCO output (Q) always follows the phase and frequency of the input signal (IN). The input signal and the VCO output are normally square waveforms. A charge pump circuit is the circuit portion of the phase-locked loop system which charges and discharges the loop filter based on the phase difference between the reference clock and the output clock. Because the output of a charge pump circuit directly drives the voltage-controlled oscillator (VCO), the PLL circuit's output jitter is very sensitive to the performance of a charge pump circuit. Conventionally, a singled-ended charge pump is used in a PLL circuit. However, in order to obtain better performance, a differential circuit architecture is adopted to reduce the common-mode noise, especially for high-speed and low-jitter applications. One well-known problem associated with a differential-mode charge pump circuit is that both DC outputs of the charge pump circuit are floating. A prior art solution to the floating DC output problem is to use common-mode feedback (CMFB) circuitry to control the output DC voltages. The function of CMFB circuitry is to sense the output voltages from the differential charge pump and keep the output common-mode voltage at a constant level. However, since the CMFB circuitry is dependent on the output voltages of the differential charge pump circuit, the CMFB circuitry always moves up and down according to the variations in the charge pump's output voltages. Further, the bandwidth of CMFB circuitry is comparable to the operating frequency range of the PLL circuit, and thus has shortcoming and limitations in high-frequencies applications greater than 400 MHz. The bandwidth dependency limitation results in the CMFB circuitry being unstable and reduces the PLL circuit's performance.

Accordingly, a need is seen to exist for circuitry that controls a differential charge pump in a manner such that the common-mode output voltage is independent of the control circuitry, and thus avoids the instability problems associated with CMFB circuitry.

It is therefore a primary object of the present invention to provide a control circuit for controlling the common-mode output voltage of a differential charge pump circuit. The control circuitry is configured in a non-common-mode feedback manner to avoid instability problems associated with CMFB circuitry.

A related object of the present invention is to provide a control circuit for use in phase-locked loop and delayed-lock loop circuit applications which control the common-mode output voltage of the differential charge pump circuit by using control circuitry configured in a non-common-mode feedback manner to avoid instability problems associated with CMFB circuitry.

BRIEF SUMMARY OF THE INVENTION

A phase-locked loop (PLL) system typically consists of a phase comparator, a charge pump circuit, a RC loop filter and a voltage-controlled oscillator (VCO), generally as shown in FIGS. 1a and 1b. A PLL system is a negative feedback system which operates in such a way that the phase and frequency of the VCO output (Q) always follows the phase and frequency of the input signal (IN). The input signal (IN) and the VCO output Q are normally square waveforms. In accordance with the objects of the present invention, as shown in FIG. 1b, a replica circuit is used in the charge-pump circuit to define the DC output voltages OUTP and OUTN. The replica circuit is used to replace the function of CMFB circuitry, namely to sense the output voltages from the differential charge pump and keep the output common-mode voltage at a constant level. But unlike CMFB circuitry, which is always moving up and down by tracking the output voltages from the charge pump, the replica circuit of the present invention only provides a constant DC voltage to define the DC output voltages OUTP and OUTN and is thus independent of frequency and avoids the bandwidth concern. Further, because the replica circuit is independent of frequency, the charge pump circuit is more stable.

Accordingly, the foregoing objects are accomplished by providing, in a preferred embodiment, a replica circuit which comprises a high gain operational amplifier and at least three MOS transistor means electrically coupled to the differential charge pump circuit. The operational amplifier generates the DC output voltage which is used to define the common-mode voltage of the charge pump circuit. The three transistors are configured in replica of one-half of the charge pump circuit. The operational amplifier is provided with a bias voltage at the inverting-end input terminal. During operation, the high gain of the operational amplifier forces the non-inverting end of the operational amplifier to the same value as the bias voltage supplied to the inverting-end input. This voltage equalization effect is referred to as the replica effect. As a result of the replica effect, the charge pump's DC output voltages OUTP and OUTN also follow the voltage at non-inverting end of the operational amplifier which results in stable operation of charge pump and a control circuit which is more suitable for high-frequency application of phase-locked loops.

Therefore, to the accomplishments of the foregoing objects, the present invention consists of the foregoing features hereinafter fully described and particularly pointed out in the claims, the accompanying drawings and the following disclosure describing in detail the invention, such drawings and disclosure illustrating but one of the various ways in which the invention may be practiced.

DESCRIPTION OF THE PREFERRED EMBODIMENT INVENTION

Figure 1A:
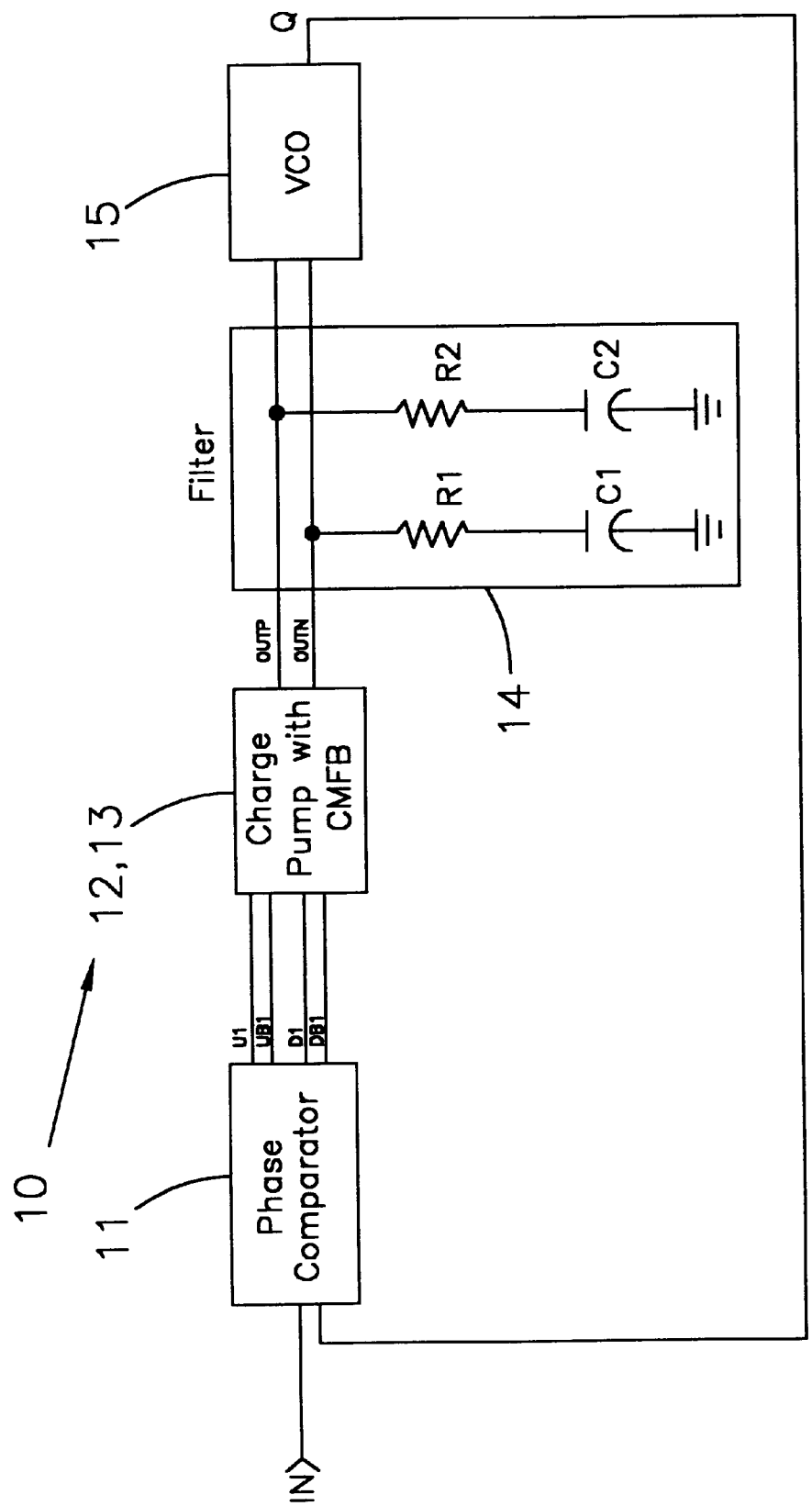
FIG. 1a shows a block diagram of a prior art differential-mode phased-locked loop (PLL) system.
Figure 6A:
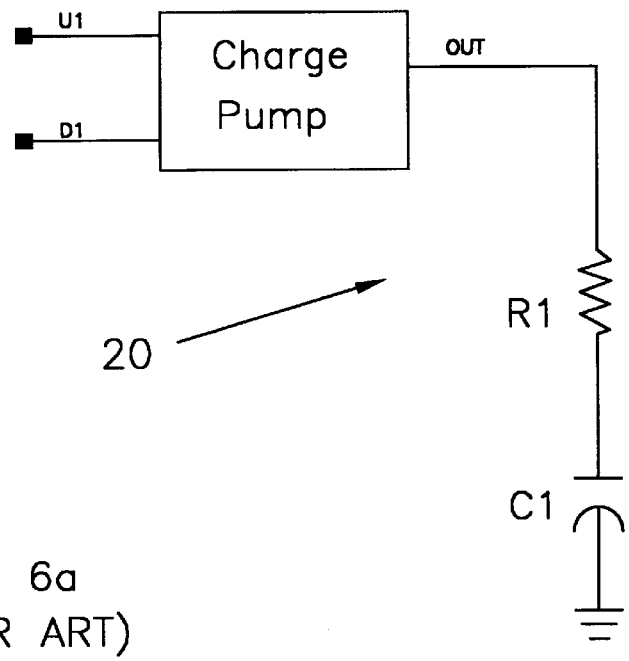
FIG. 6(a) shows a traditional single-ended charge pump circuit.

Traditionally, a single-ended charge pump structure 20 as shown in FIG. 6a was used to implement a phase-locked loop (PLL) system. As shown in FIG. 6a, only the signals U1, D1, OUTP (or OUTN) are required, and only one set of RC filter is required. However, noise due to power supply and ground bounce, which is very severe in a high speed or highly integrated circuit applications, will impact the performance of the PLL system. The noise is unwanted, because it will cause the output of a voltage-controlled oscillator VCO to jitter and degrade the PLL performance. A differential mode charge pump circuit is a solution to reduce the noise problem, see generally FIG. 2. However, the well-known problem of a differential circuit is that the output circuit is floating, hence the DC voltage is undefined. By example, the bias point of the output voltage may vary in a large range depending on the channel modulation behavior and other parameters of MOS transistors. If the bias point is not set at the middle of the power supply $V_{DD}$, the usable operating range will be limited. In the extreme condition, the circuit will operate near $V_{DD}$, or ground region, therefore the differential circuit is not working properly. For example, if the charge pump circuit is biased at $V_{DD}$, the current sources in the charge pump current will be in linear region and will not response to the control signals, U1 and D1. Therefore the output signal OUT shown in FIG. 6a will not be able to adjust the phase of the output signal from the voltage-controlled oscillator (VCO) to be synchronized with the input signal to the PLL system. Referring generally to FIG. 1a, the frequency at the VCO output Q is proportional to the voltage difference between OUTP and OUTN of a charge pump. When the differential voltage of OUTP and OUTN are equal, i.e. V(OUTP)=V(OUTN)=VCM, the VCO will oscillate at the so-called free running frequency. When V(OUTP)>V(OUTN), the VCO frequency is increased. When V(OUTP)<V(OUTN), the VCO frequency is decreased. In a differential-mode charge pump circuit, it is very important that the common mode voltage VCM be kept constant during any voltage swing of V(OUTP) and V(OUTN), and preferably, also as near as possible to one-half of the power supply voltage, otherwise it might seriously degrade the PLL performance.

Figure 2:
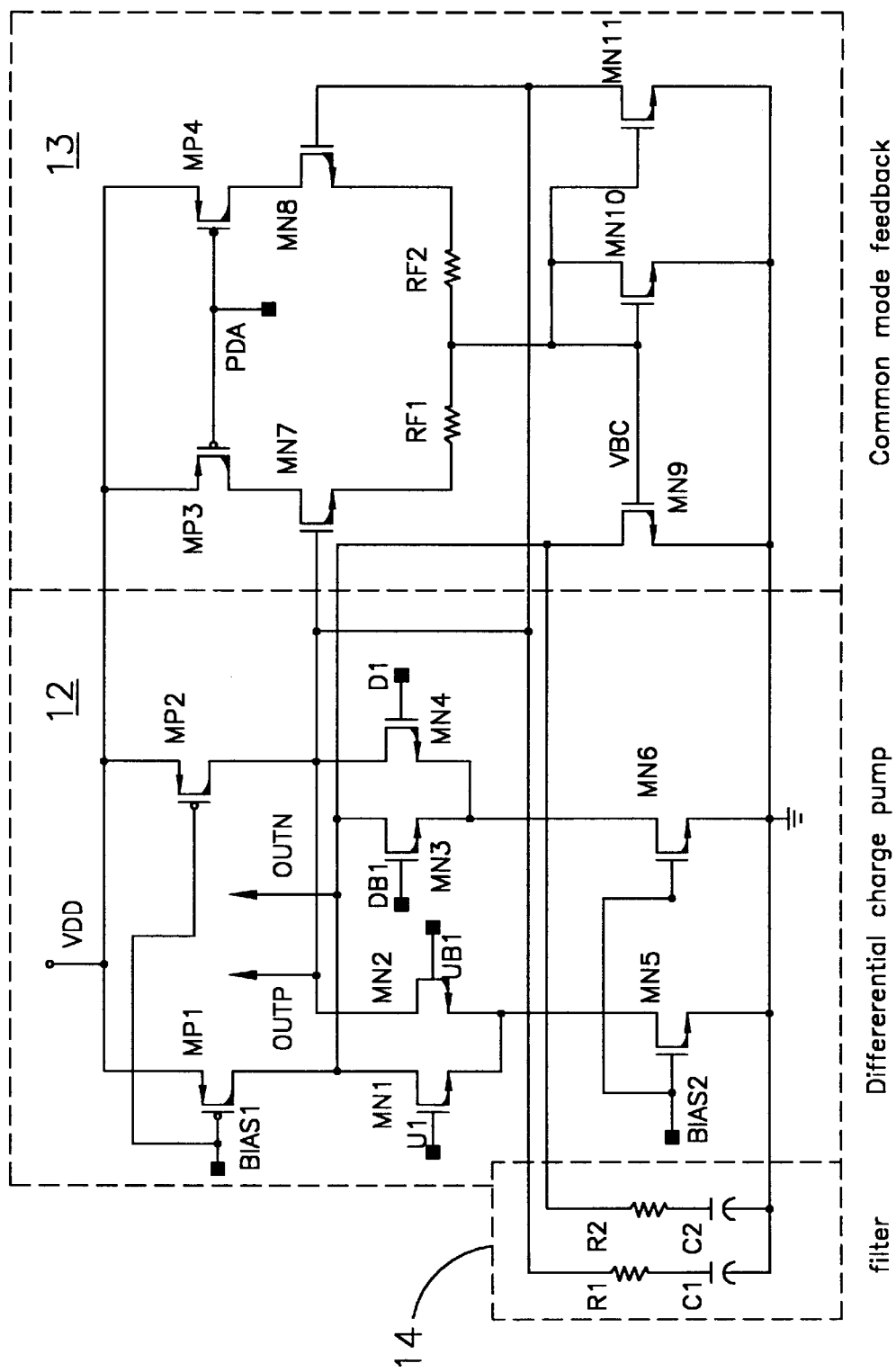
FIG. 2 shows a prior art circuit portion of a differential-mode PLL system based on common-mode feedback (CMFB) circuit used to define a common-mode voltage.

As discussed earlier, a prior art solution to the floating DC output problem is to use common-mode feedback (CMFB) circuitry to control the output DC voltages. The function of CMFB circuitry is to sense the output voltages from the differential charge pump and keep the common-mode output voltage at a constant level. FIG. 1a illustrates, in block diagram form, a prior art differential-mode phase-locked loop (PLL) system 10 comprising a phase comparator 11, a differential charge pump 12 with a common-mode feedback circuit (CMFB) 13, two loop filters (R1, R2, C1 and C2) designated by the numeral 14 and a voltage-controlled oscillator (VCO) 15. The PLL system depicted in FIG. 1a functions in a similar manner as described above. The input signal IN is a reference clock signal, typically input signal IN is an accurate clock source generated from a crystal oscillator. Phase comparator 11 compares the clock edge of IN and the output Q of VCO 15. If IN leads or lags the clock phase of signal Q, the output signals of phase comparator 11 (U1, UB1, D1 and DB1) will be generated to control charge pump circuit 11 with CMFB 13. Charge pump circuit 12 will charge or discharge the RC filters 14 depending on the clock lead/lag condition, therefore the outputs (OUTP and OUTN) of the charge pump 12 will be also adjusted. The differential voltage between OUTP and OUTN is the input signal to VCO 15, which also controls the oscillation frequency of VCO 15. By example, if IN leads in phase as compared to Q, U1 will go high (UB1 goes low) and D1 will go low (DB1 goes high). The state of these signals controls the operation of charge pump circuit 12 which generates a charging current from OUTP and a sink current from OUTN. Accordingly, the differential voltage of OUTP and OUTN will go higher. This condition will cause VCO 15 to speed up in order to catch up with the phase of the input clock signal IN. Eventually IN and Q will be in lock condition and the differential voltage of OUTP and OUTN will be maintained at a constant level. As best seen in FIG. 2, a prior art common-mode feedback (CMFB) circuit 13 is used to define the common-mode voltage of differential charge pump circuit 12. In FIG. 2, a common-mode amplifier (comprising MN7, MN8, MN9, MN10, MN11, MP3, MP4, RF1 and RF2) is used to adjust the common-mode voltage (VCM) of differential charge pump outputs OUTP and OUTN. When VCM is too high, the voltage VBC at the common-mode point is raised up, and hence the MN9 and MN11 will draw current from MP1 and MP2. Therefore the voltage of VCM will go down. On the other hand, when VCM is too low, the CMFB circuit 13 will raise VCM due to the voltage at VBC being lower. As discussed earlier, since the CMFB circuitry 13 is dependent on the output voltages of the differential charge pump circuit 12, the CMFB circuitry 13 varies according to the variations in the charge pump's output voltages. Further, the bandwidth of CMFB circuitry 13 is comparable to the operating frequency range of the PLL circuit, and thus has shortcoming and limitations in high-frequencies applications greater than 400 MHz. The bandwidth dependency limitation results in the CMFB circuitry being unstable and reduces the PLL circuit's performance.

Figure 1B:
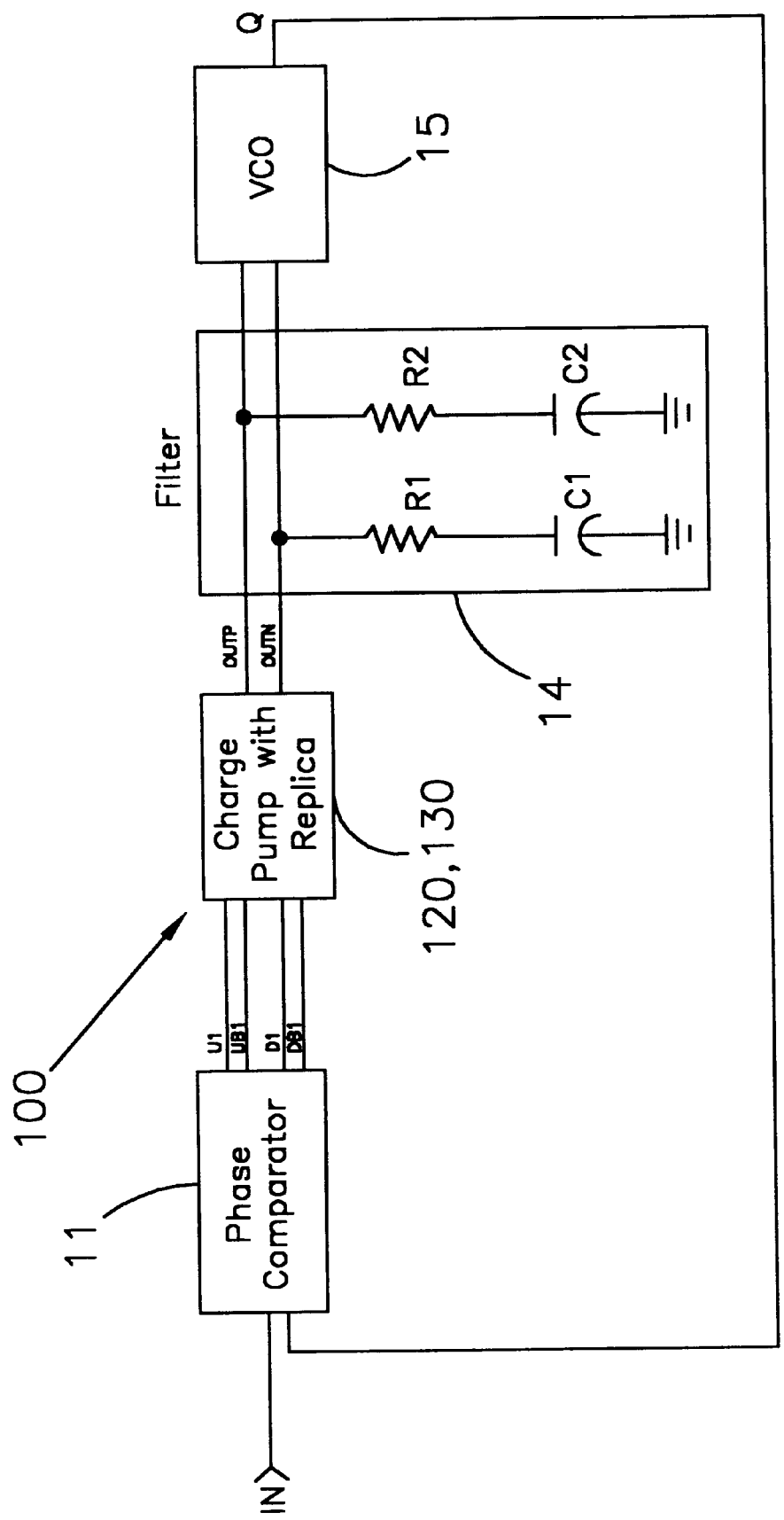
FIG. 1b shows a block diagram of a differential-mode phased-locked loop (PLL) system having a differential charge pump circuit controlled by a replica circuit in accordance with the present invention.
Figure 3:
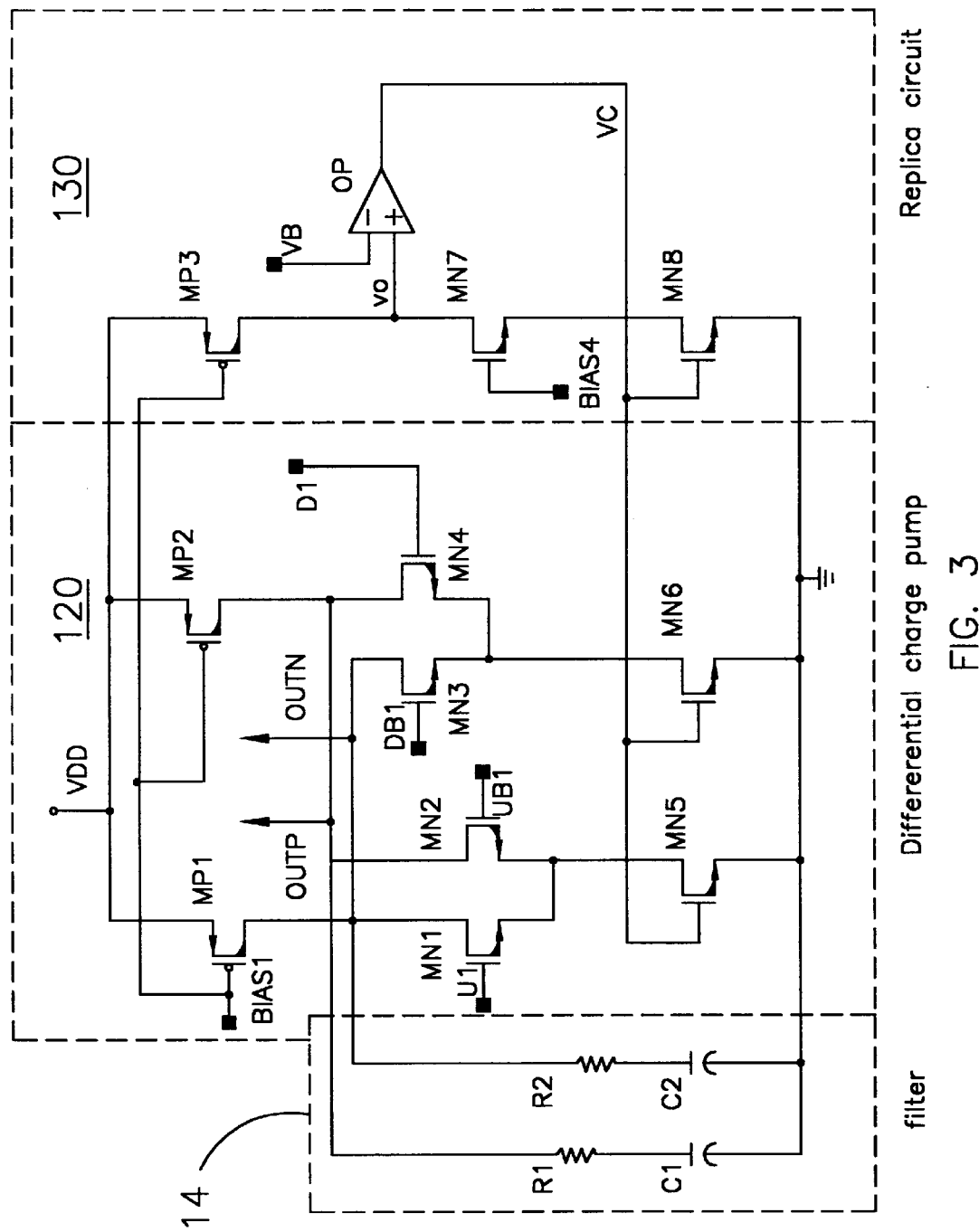
FIG. 3 shows a differential-mode charge pump circuit coupled to a replica circuit for defining the common-mode voltage output in accordance with the present invention.

FIG. 1b illustrates, in block diagram form a differential-mode phase-locked loop (PLL) system 100, in accordance with the present invention, comprising a phase comparator 11, a differential charge pump 120 with a replica circuit 130, two loop filters (R1, R2, C1 and C2) designated by the numeral 14 and a voltage-controlled oscillator (VCO) 15. FIG. 3 shows differential charge pump circuit 120 using replica circuit 130 in accordance with the present invention to define the common-mode voltage VCM. VCM is the common-mode voltage of the charge pump output OUTP and OUTN. VB is a bias voltage which is applied to the negative input of the operational amplifier (OP). By example, the sizes of metal-oxide semiconductor (MOS) transistors MP1 to MP3 are the same, as are the sizes of MN1 to MN4 and MN7, and also the sizes of MN5 to MN6 and MN8. It should be noted that bipolar transistors could be used in place of MOS transistors. The output (VC) of OP controls the gates of transistors MN5, MN6 and MN8, the feedback path is connected from the drain of MN7. Due to the high gain of OP, the feedback effect forces VO=VB, where VB is a constant bias voltage used to define the common-mode voltage of the charge pump circuit. Because of the replica effect, the common-mode voltage on OUTP and OUTN is equal to VB (and VO). The replica effect forces the charge pump's DC output voltages OUTP and OUTN to follow the voltage at the non-inverting end of the operational amplifier OP which results in stable operation of charge pump and a control circuit which is more suitable for high-frequency application of phase-locked loops. The following analysis will further explain the objects of the replica circuit 130 to maintain VCM of the differential charge pump circuit 120 at a constant value.

There are four states of input signals U1, UB1, D1 and DB1, that are of interest.

These states are:

State I: When U1=D1=0 and UB1=DB1=1 (in lock state),

State II: When UB1=D1=0 and U1=DB1=1 (in charge state),

State III: When U1=DB1=0 and UB1=D1=1 (in discharge state), and

State IV: When UB1=DB1=0 and U1=D1=1 (in idle-pulse state).

State I can be analyzed as follows:

The transistors MN1 and MN4 are turned off, and

I(MP1)=I(MN3)+I(R2)=I(MN6)+I(R2)

I(MP2)=I(MN2)+I(R1)=I(MN5)+I(R1).

Because I(MP1)=I(MN3)=I(MN6) and I(MP2)=I(MN2)=I(MN5), and I(R1)=I(R2)=0, this means that V(OUTP) and V(OUTN) will be maintained constant, and accordingly the common-mode voltage VCM is unchanged.

State II can be analyzed as follows:

Transistors MN2 and MN4 are turned off, and

I(MP1)=I(MN3)+I(R2)+I(MN1)=I(MN6)+I(R2)+I(MN5)

I(MP2)=I(R1)

Because I(MP1)=I(MN3)=I(MN5)=I and I(MP2)=I, where I is a constant bias current, then I(R1)=I and I(R2)=−I. V(OUTP) is increased and V(OUTN) is decreased by the same amount of voltage, therefore the common-mode voltage VCM still keep constant.

State III can be analyzed as follows:

Transistors MN1 and MN3 are turned off, and

I(MP1)=I(R2)=I

I(MP2)=I(MN2)+I(R1)+I(MN4)=I(MN5)+I(R1)+I(MN6)

Because I(MP2)=I(MN2)=I(MN4)=I and I(MP2)=I(MN5)=I(MN6)=I, I(R1)=−I and I(R2)=I, then V(OUTP) is decreased and V(OUTN) is increased by the same amount and VCM will also keep constant.

State IV can be analyzed as follows:

Transistors MN2 and MN3 are turned off, and

I(MP1)=I(R2)+I(MN1)=I(R2)+I(MN5)

I(MP2)=I(R1)+I(MN4)=I(R1)+I(MN6)

Because I(R1)=I(R2)=0, V(OUTP), V(OUTN) and VCM will keep constant.

The above explanation demonstrates the basic operation of the differential charge pump circuit 120 based on using replica circuit 130 as a common-mode defining circuit, and shows how the common mode voltage VCM of the charge pump circuit 120 is always kept at a constant voltage in all the possible states of input signals to a PLL system as depicted in FIG. 3.

To further describe the objects of the present invention and the effectiveness of the replica circuit 130 as shown in FIG. 3, the following analysis will be utilized to define output voltage VO. The current IMP3 in transistor MP3 (equal to current in transistor MN8, equal to IMN8) is determined as follows:

$$I_{MP3}=(\beta_p/2)*(Vgsp-Vtp)*(Vgsp-Vtp)*(1+\lambda*(V_{DD}-Vo))=I_{MN8} \quad (Eq1)$$

Where:

Vgsp is the gate to source voltage of MP3,

Vtp is the absolute threshold voltage of transistor MP3, $\lambda$ is the channel modulation factor of transistor MP3, and $I_{MN8}$ is the current of transistor MN8.

For simplicity, define Io as:

$$Io=(\beta_p/2)*(Vgsp-Vtp)*(Vgsp-Vtp). \quad (Eq2)$$

By rearranging (Eq1) we have:

$$VO=V_{DD}-(I_{MN8}/Io-1)/\lambda \quad (Eq3)$$

which is an expression for VO without the feedback of operational amplifier OP. However, because of the feedback of amplifier OP in replica circuit 130, the current in transistor MP3, or MN8 can be expressed as:

$$I_{MN8}=(\beta_n/2)*(Vgsn-Vtn)*(Vgsn-Vtn). \quad (Eq4)$$

Where:

Vgsn is the gate to source voltage of MN8, and

Vtn is the threshold voltage of transistor MN8.

In (Eq4) if the channel modulation effect is ignored, and Vgsn is defined as follows:

$$Vgsn=A*(VO-VB)+Voff \quad (Eq5)$$

where A and Voff are the gain and offset voltage of amplifier OP, respectively.

After rearranging (EqS), VO can be expressed as:

$$VO=VB+(1/A)*(Vgsn-Voff) \quad (Eq6)$$

Figure 4:
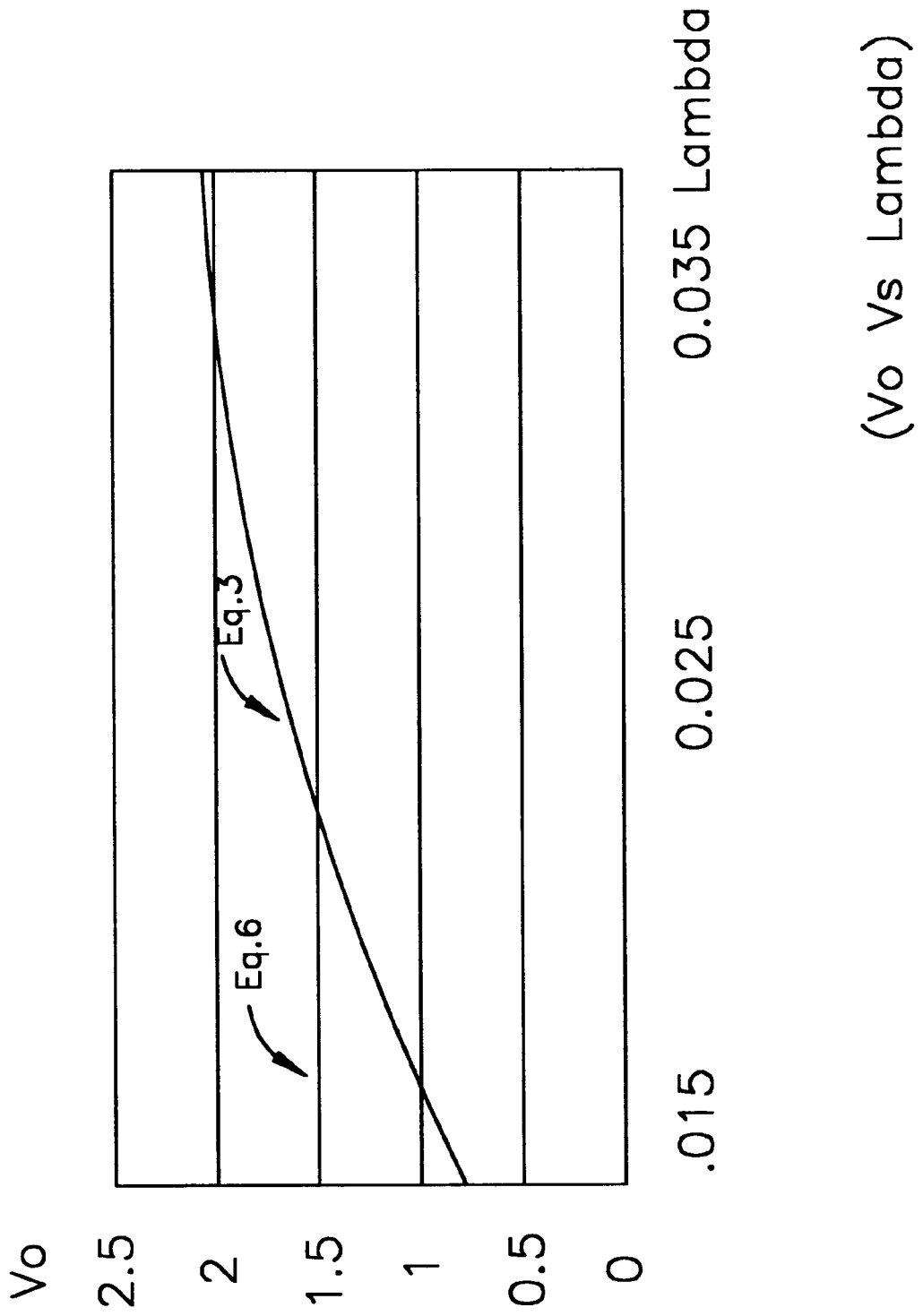
FIG. 4 shows the comparison of the common-mode output voltage Vo with and without the replica circuit of the present invention.

Equation (Eq3) represents the expression for VO without replica circuit 130, and shows that VO is sensitive to the channel modulation factor $\lambda$. Equation (Eq6) shows the output with replica circuit 130, and is insensitive to variation of the channel modulation factor $\lambda$. As best seen in FIG. 4 showing plots of Eq3 and Eq6, and assuming the following conditions where: VB=1.5v, Vgsn=1v, Io=30 uA, $I_{MN8}$=31uA, Vtn=0.6V, A=100 and λ varies from 0.015 to 0.035 (1/v), the output voltage VO with replica circuit 130 is seen to be controlled at a fixed voltage. This benefits differential charge pump circuit 120 because of the replica circuit effect, where by inspection, the common-mode output voltage (VCM) of OUTP and OUTN is equal to VO. As previously described, by maintaining VO at a constant voltage, the differential charge pump circuit 120 can be operated in a controllable optimum output range.

Figure 1C:
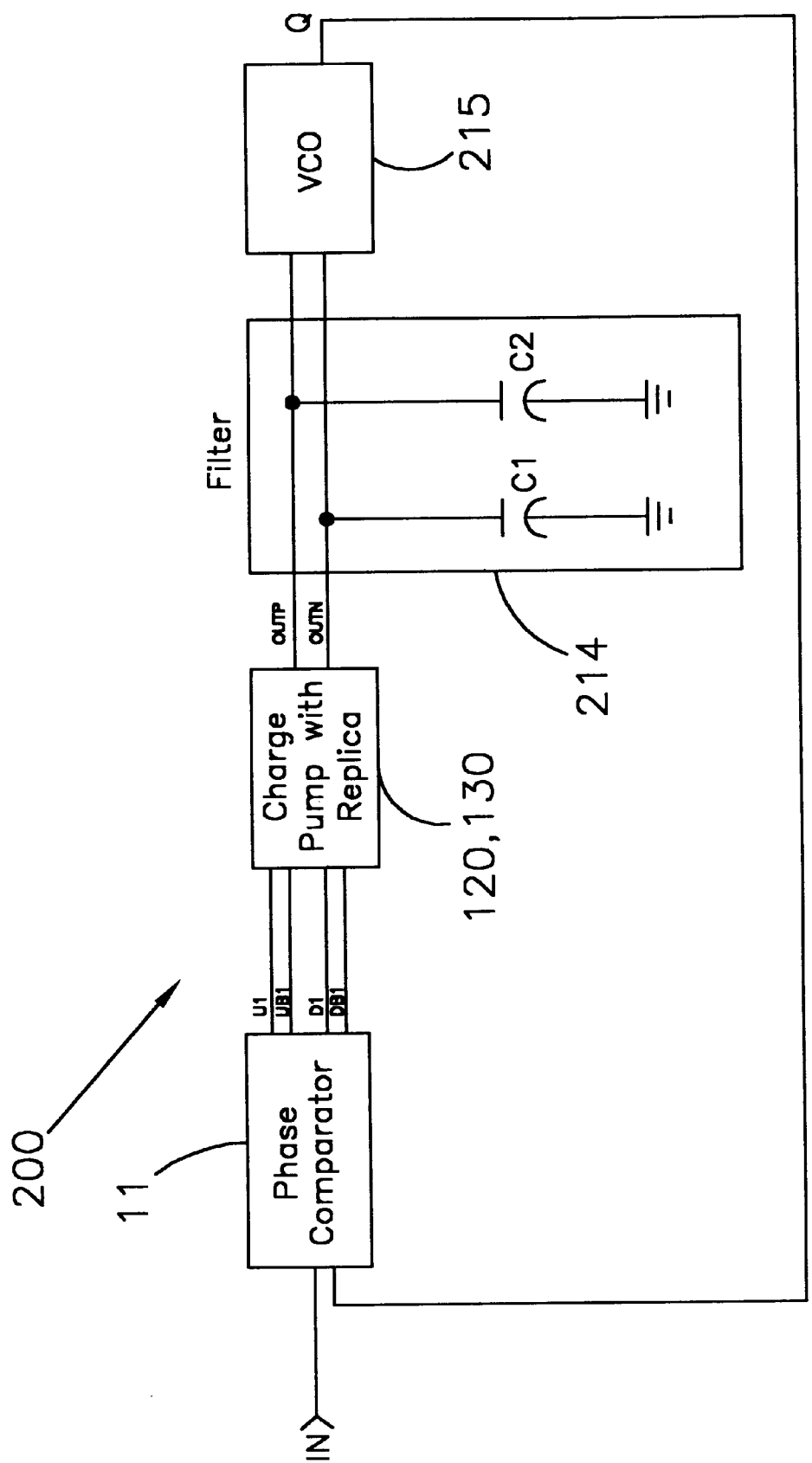
FIG. 1c shows a block diagram of a differential-mode delay-locked loop (DLL) system having a differential charge pump circuit controlled by a replica circuit in accordance with the present invention.
Figure 5A:
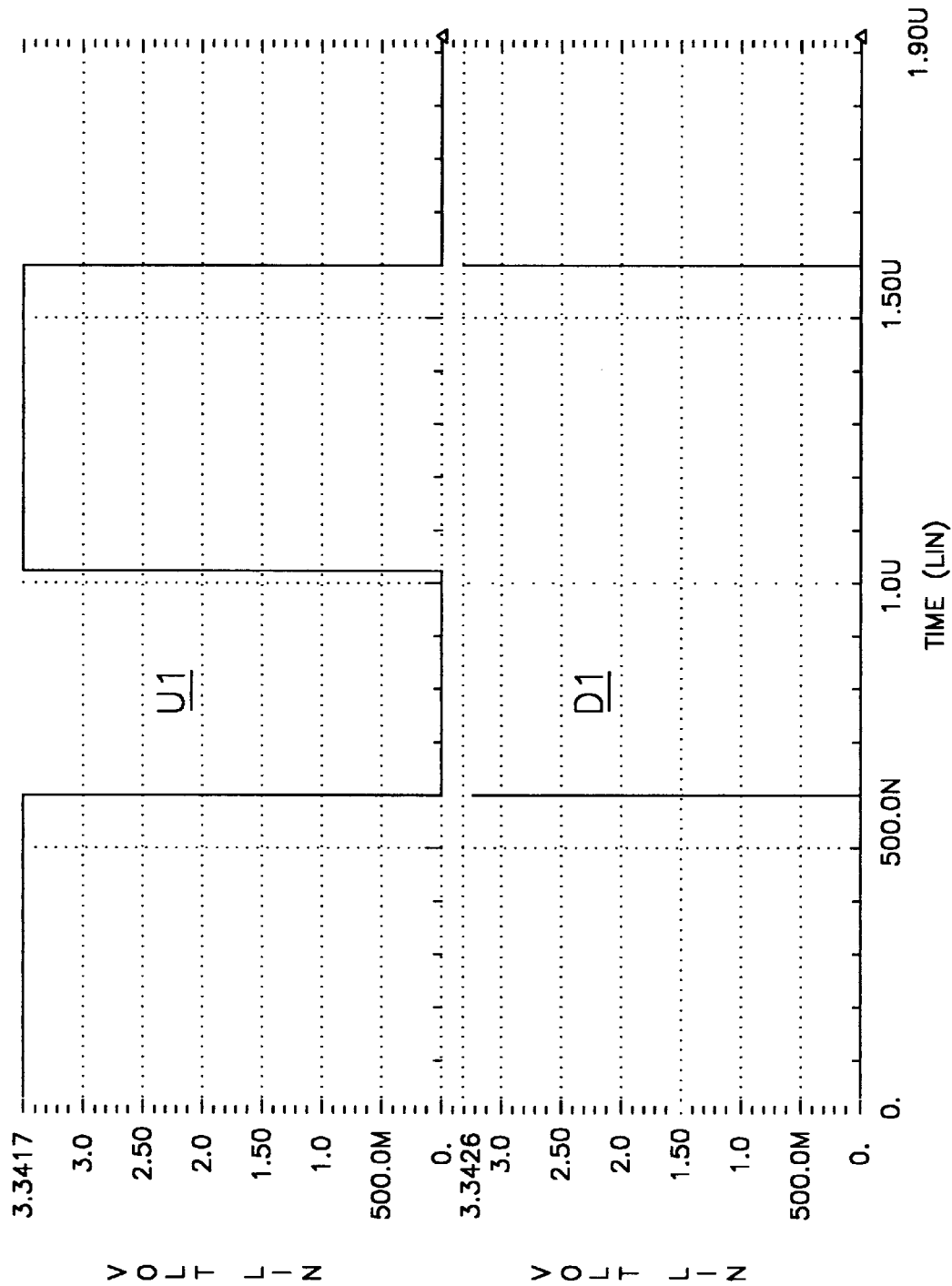
FIG. 5(a) shows the waveforms of U1 and D1 used for alternatively controlling a charge state and lock state of the charge pump, and which help generate the common-mode feedback and replica circuit output voltages(VCM) shown in FIG. 5(b).
Figure 5B:
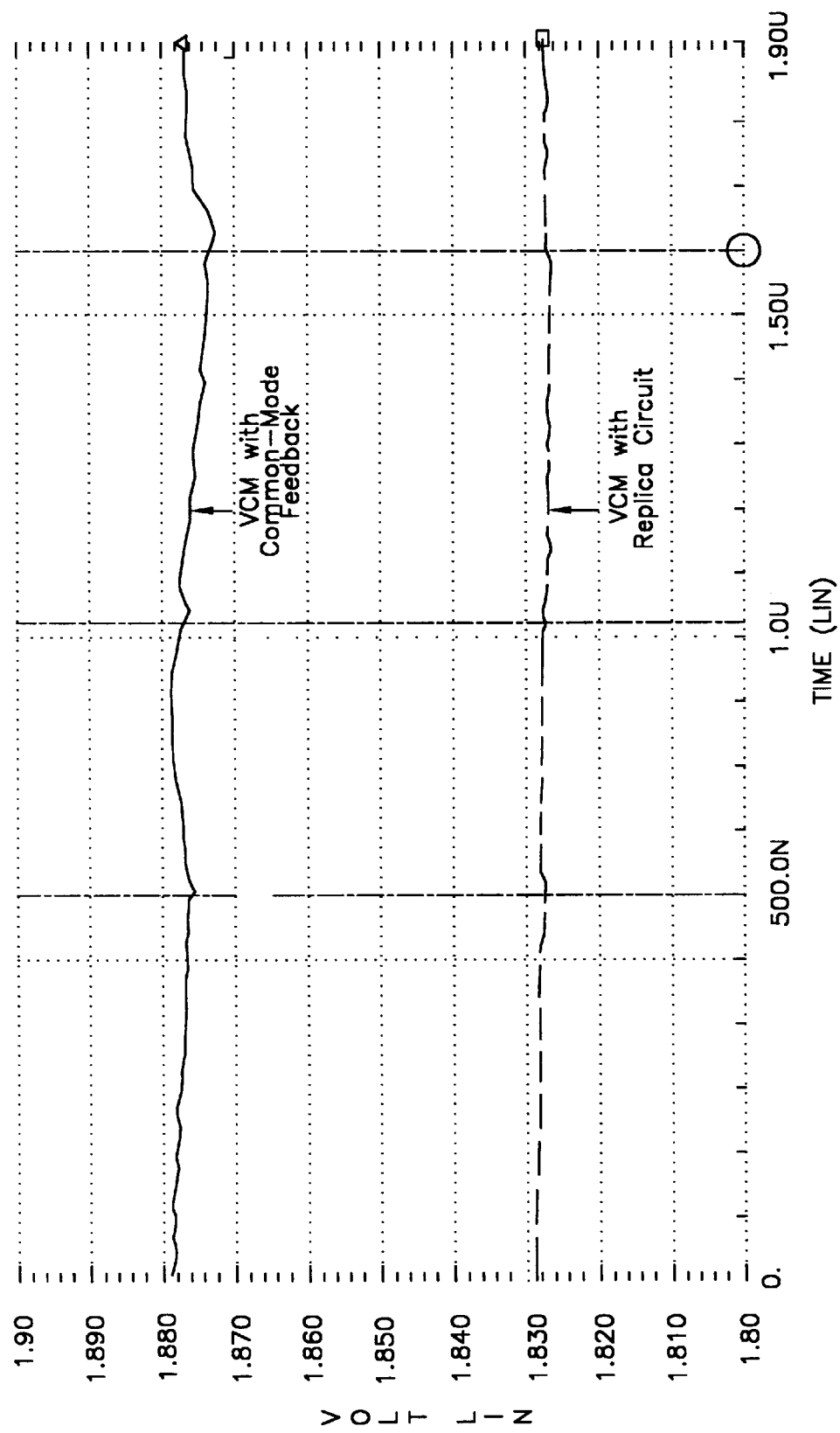
FIG. 5(b) shows comparison waveforms of the common-mode output voltage (VCM) of a differential charge pump circuits using the common-mode feedback and another differential charge pump circuit using the replica circuit in accordance with the present invention.

A SPICE circuit simulation was done to exemplify the benefits of the replica circuit 130. FIG. 5(b) shows the comparison of the common-mode output voltage (VCM) of OUTP and OUTN during the charge state and lock states for both differential charge pump circuits 12 and 120 shown in FIG. 2 and FIG. 3. The waveforms for control signals U1 and D1 are shown in FIG. 5(a). When the signals U1 and D1 are applied to the circuit of FIG. 2, the upper waveform as generated by SPICE and as shown in FIG. 5(b) results. Thus, when U1 goes up, the charge pump circuit 12 starts to charge OUTP and discharge OUTN. As depicted, VCM will decrease due to the non-linear behavior of the CMFB circuit 13. Circuit 13 will try to adjust the common mode voltage VCM to keep it constant. However, as seen in upper waveform in FIG. 5(b), the common mode voltage VCM changes from 1.875V to 1.878V due to the adjustment performed by CMFB circuit 13. When the signals shown in FIG. 5(a) are applied to the circuit of FIG. 3, the lower waveform generated by SPICE and as shown in FIG. 5(b) results. The SPICE circuit simulation of FIG. 3 shows that the common mode voltage VCM of the charge pump circuit 120, with replica circuit 130, is always constant because dynamic adjustments are not required. The replica circuit 130 as shown in FIGS. 1b and 3 is seen to be more suitable for higher-frequency PLL system applications than the prior art common mode feedback circuit 13. Further, although the foregoing description has been directed to an application of the invention for use in phase-locked loop (PLL) circuit applications, the present invention may also be practice in other integrated circuit areas, such as in delay-locked loop (DLL) system 200 shown in FIG. 1c. As shown in FIG. 1c, the voltage-controlled oscillator circuit VCO 215 shown in FIG. 1b is replaced by a voltage-controlled delay circuit 16 and a loop filter 214 comprising single capacitors. In contrast with the PLL system, the DLL system application adjusts the phase to align with the phase of the input clock signal, whereas in the PLL system application the frequency is adjusted through the VCO.

Figure 6B:
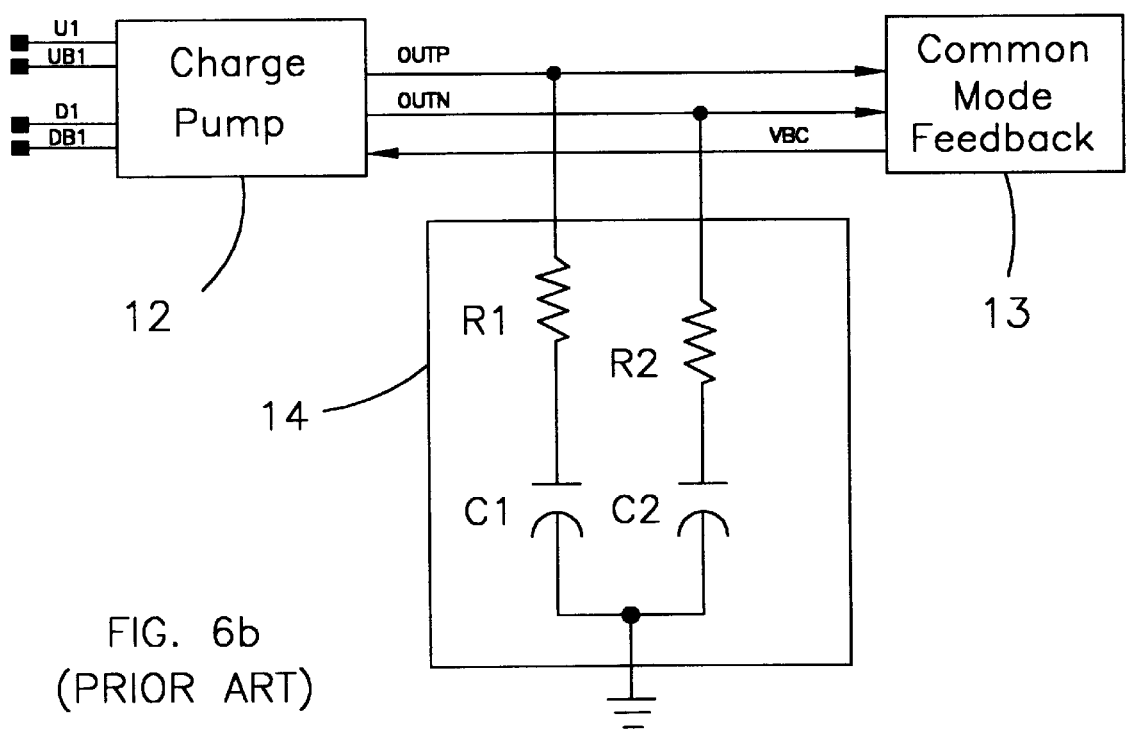
FIG. 6(b) is a differential charge pump circuit with traditional common-mode feedback.
Figure 6C:
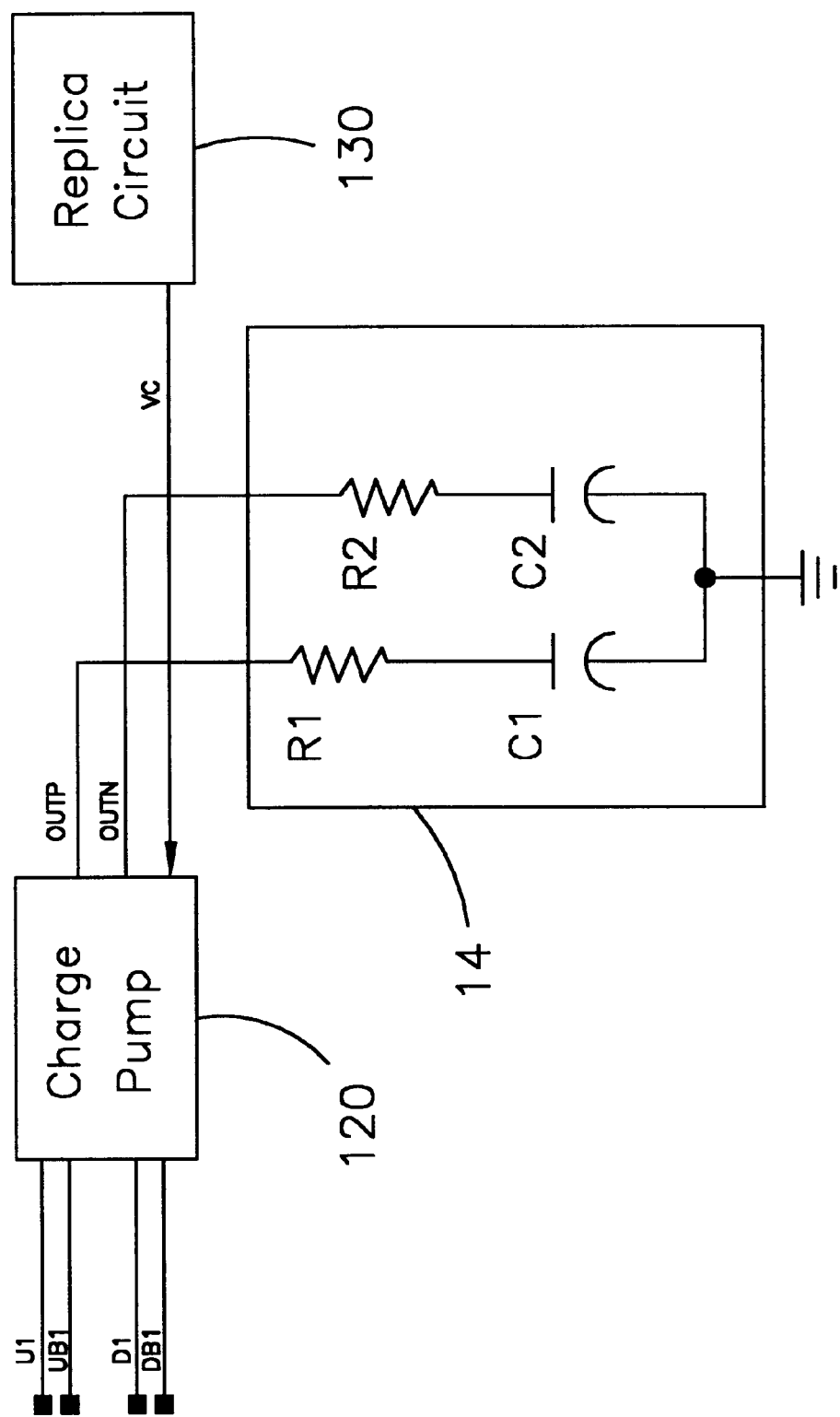
FIG. 6(c) shows a differential charge pump circuit with a replica circuit in accordance with the present invention.

For an overall understanding of the improvements to charge pump circuits, reference is made to the general circuit schematics shown in FIGS. 6(a), 6(b) and 6(c). FIG. 6(a) illustrates a traditional single-ended charge pump circuit 20. As stated previously, this configuration is highly susceptible to power supply and ground bounce noise. FIG. 6(b) shows an improved architecture, which adopts differential charge pump circuit 12 with common mode feedback circuit 13 to reduce the power supply and ground bounce noise, however, the dynamic feedback has the potential problem of bandwidth limitation and stability. FIG. 6(c) shows again the differential charge pump circuit 120 using replica circuit 130. As described above, because replica circuit 130 generates a constant output value VO, and because of the replica effect, the common-mode output voltage VCM of the differential charge pump 120 is also constant during operation of a PLL, or a DLL system.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. The inventions illustratively disclosed herein may be practiced without any element which is not specifically disclosed herein.

We claim:

1. A differential charge pump circuit apparatus for use in high-speed phase-locked loop circuits, said apparatus comprising:

a differential charge pump circuit, said differential charge pump circuit having a common-mode output voltage associated with a plurality of dc output voltages; and a replica circuit means for generating a DC output voltage for controlling said common-mode output voltage, said replica circuit means being configured in replica of one-half of said differential charge pump circuit and being electrically coupled to said differential charge pump circuit, said generated DC output voltage being generated independent of said plurality of DC output voltages such that said common-mode output voltage is maintained at a constant value for maximizing an operating range of said differential charge pump circuit for driving a voltage-controlled oscillator circuit.

2. A differential charge pump circuit apparatus as described in claim 1, wherein:

said replica circuit means comprises an operational amplifier and at least three transistor means, said at least three transistor means being electrically coupled to said differential charge pump circuit, and said operational amplifier generates said DC output voltage.

3. A differential charge pump circuit apparatus as described in claim 2, wherein:

said at least three transistors comprise MOS transistor devices.

4. A differential charge pump circuit apparatus as described in claim 2, wherein:

said at least three transistors comprise bipolar transistor devices.

5. A differential charge pump circuit apparatus for use in high-speed delay-locked loop circuits, said apparatus comprising:

a differential charge pump circuit, said differential charge pump circuit having a common-mode output voltage associated with a plurality of dc output voltages; and a replica circuit means for generating a DC output voltage for controlling said common-mode output voltage, said replica circuit means being configured in replica of one-half of said differential charge pump circuit and being electrically coupled to said differential charge pump circuit, said generated DC output voltage being generated independent of said plurality of DC output voltages such that said common-mode output voltage is maintained at a constant value for maximizing an operating range of said differential charge pump circuit for driving a voltage-controlled delay circuit.

6. A differential charge pump circuit apparatus as described in claim 5, wherein:

said replica circuit means comprises an operational amplifier, and at least three transistor means, said at least three transistor means being electrically coupled to said differential charge pump circuit, and said operational amplifier generates said DC output voltage.

7. A differential charge pump circuit apparatus as described in claim 6, wherein:

said at least three transistors comprise MOS transistor devices.

8. A differential charge pump circuit apparatus as described in claim 6, wherein:

said at least three transistors comprise bipolar transistor devices.

9. A method for maximizing an operating range of a differential charge pump circuit, said method comprising the steps of:

(a) providing a differential charge pump apparatus comprising:

a differential charge pump circuit, said differential charge pump circuit having a common-mode output voltage associated with a plurality of dc output voltages; and a replica circuit means for generating a DC output voltage for controlling said common-mode output voltage, said replica circuit means being configured in replica of one-half of said differential charge pump circuit and being electrically coupled to said differential charge pump circuit, said generated DC output voltage being generated independent of said plurality of DC output voltages such that said common-mode output voltage is maintained at a constant value for maximizing an operating range of said differential charge pump circuit for driving a voltage-controlled oscillator circuit;

(b) providing a bias voltage to operate said replica circuit means;

(c) generating said DC output voltage;

(d) controlling said common-mode output voltage; and (e) maximizing said operating range of said differential charge pump circuit between a power supply voltage and a circuit ground.

* * * * *